United States Patent [19]

Kelly

[11] 4,453,754

[45] Jun. 12, 1984

[54] ELECTRONIC PLUG-IN MODULE EXTRACTOR

[75] Inventor: John R. Kelly, Indianapolis, Ind.

[73] Assignee: The United States of America as represented by the Secretary of the Navy, Washington, D.C.

[21] Appl. No.: 361,330

[22] Filed: Mar. 25, 1982

[51] Int. Cl.³ .............................................. B65G 7/02
[52] U.S. Cl. ..................................................... 294/15
[58] Field of Search .................. 294/15, 34, 26, 1; 29/781, 758, 759, 764, 278; 81/3 R, 38

[56] References Cited

U.S. PATENT DOCUMENTS

| 3,178,214 | 4/1965 | Tinkelenberg | 294/15 |
| 3,180,670 | 4/1965 | Pryde | 294/15 |
| 3,484,129 | 1/1968 | Askren | 294/15 |
| 3,759,559 | 9/1973 | Yuska | 294/15 |

*Primary Examiner*—James B. Marbert
*Attorney, Agent, or Firm*—Robert F. Beers; Paul S. Collignon

[57] ABSTRACT

An extracting tool for removing an electronic plug-in module from a chassis assembly applies, by mechanical advantage, a large extracting force to a module. An extractor plate engageable with a plug-in module is slidably connected to a frame and a rotatable cam is provided for linearly moving the extractor plate. A handle integral with the cam is used for rotating the cam, and a cam surface on the handle is used to return the extractor plate to a starting position when the handle is moved in a reverse direction.

2 Claims, 3 Drawing Figures

ELECTRONIC PLUG-IN MODULE EXTRACTOR

BACKGROUND OF THE INVENTION

The present invention relates to an extracting tool for removing a plug-in module board from a module mounting frame and, more particularly, to an extracting tool which can apply a large extracting force due to mechanical advantage applied by the extractor.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, the Department of the Navy, as well as other military branches, have been engaged in a standard hardware program in which electronic plug-in modules have been developed which are capable of meeting various system requirements. Generally, a plug-in module is designed for high reliability and, whenever possible, have a cost which will permit them to be thrown away rather than be repaired. One such plug-in module is shown in U.S. Pat. No. 3,243,660, entitled "Electronic Module Assembly", which issued Mar. 29, 1966, to Leonard J. Yuska and David P. Zimmerman.

One concept of a standard hardware program is to have a plurality of modules which plug-in a chassis to form an assembly and normally these plug-in modules slide in grooves or ways in the chassis and engage a mating female connector. As the basic module connector consists of 40 metal bayonet pins, removal of a plug-in module from a chassis normally presents a problem, as any lateral movement could damage the small bayonet pins.

Various pulling tools or extractors have been devised to facilitate the removal of a plug-in module from a chassis, and these tools are designed so that an operator can withdraw the module with controlled force. One such device which has been developed for the Navy hardware program is shown in U.S. Pat. No. 3,180,670, entitled "Chassis Pulling Tool", which issued Apr. 27, 1965, to Thomas R. Pryde. In this chassis pulling tool, first and second U-shaped members are provided, with the legs of an inner U-shaped member being slidably mounted through holes in an outer U-shaped member. The legs of the inner U-shaped member are constructed and arranged so as to engage a plug-in module which is to be removed from a chassis.

While the chassis pulling tool of the above-mentioned patent permits an operator to easily withdraw a plug-in module from a chassis, the chassis pulling tool is lacking in universal application and will operate with only one specific design. In order to eliminate the necessity of having a multiple number of pulling tools of various sizes, a universal extractor tool was developed for the standard hardware program. This tool is shown and described in U.S. Pat. No. 3,484,129, entitled, "Universal Extractor Tool" which issued Dec. 16, 1969, to Sherman G. Askren. This patented universal extractor tool eliminates the necessity of having a multiple number of extracting tools, however, it has one disadvantage. It has been determined that an extraction force of about 27 pounds is required to remove some types of plug-in modules from a chassis and, when this force is applied by the extractor tool, there is propensity for the module to accelerate violently upon release of contact pins from their sockets and to decelerate even more violently when the sliding portion of the tool reaches the tool stops. The reversed high G-force can be detrimental to the rather fragil module.

The universal extractor tool shown and described in U.S. Pat. No. 3,759,559, which issued Sept. 18, 1973, to Leonard J. Yuska, overcame the deficiency described for the extractor shown in U.S. Pat. No. 3,484,129, by providing first and second resistive forces provided by a non-metallic material, that is, a resilient cushion which is provided with a wide slot thereby forming an elongated oval shaped cushion. A relatively small force is required to move a slidable extracting member until the slot becomes closed and then a greater force is required for additional movement.

The extracting tools shown and described in U.S. Pat. Nos. 3,484,129 and 3,759,559, are designed for operation by an operator using one hand, and sufficient force can be applied to separate a 40-pin male connector from a mating female connector. Recently, however, the standard hardware program conducted by the Department of the Navy, has been considering expanding to use 100, and even 200, pin connectors, and it has already been determined that a one-hand, squeeze-type extractor will not supply sufficient force to separate the male and female connectors.

SUMMARY OF THE INVENTION

The present invention relates to an extractor tool which, by mechanical advantage, applies a large extracting force for removing a plug-in module from a chassis. An extractor plate is slidably connected to a frame, and has a cam pin which is engageable with a cam surface on an extracting cam. A handle integral with the extracting cam is used to rotate the extracting cam against the cam pin thereby changing rotational motion to straight-line motion. The extractor plate has a pair of pins which are engageable with holes in the plug-in module assembly and straight-line motion of the extractor plate separates a male connector from its mating female connector.

It is therefore a general object of the present invention to provide an extracting tool which can provide a very large force for separating electrical connectors.

Other objects and advantages of the present invention will be readily appreciated as the same becomes better understood by reference to the following detailed description when considered in connection with the accompanying drawing.

DESCRIPTION OF THE PREFERRED EMBODIMENT

Figure 1:
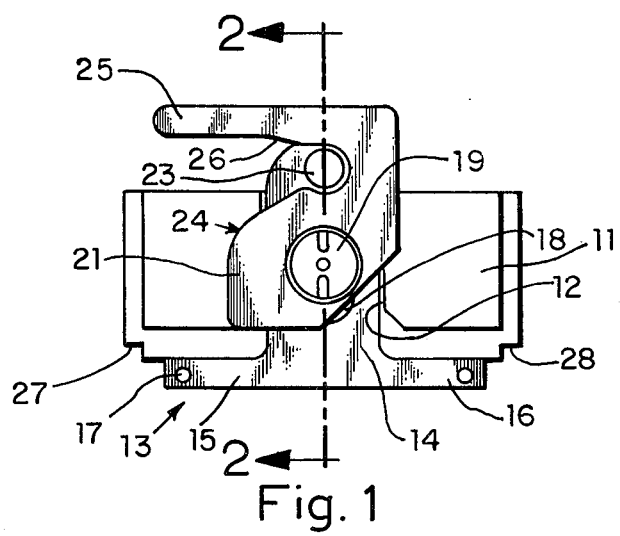
FIG. 1 is a front view of a preferred embodiment of the invention and showing an extractor plate in a down position.
Figure 2:
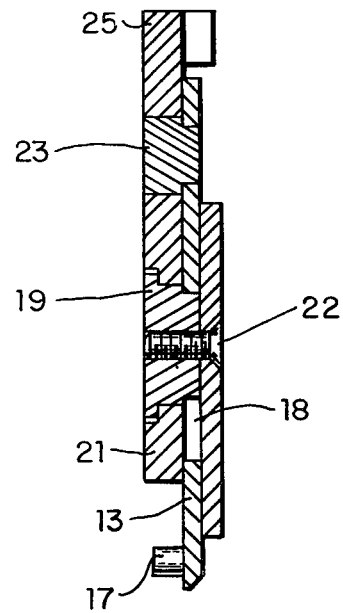
FIG. 2 is a sectional view taken on line 2—2 of FIG. 1.

Referring now to the drawing, a frame 11 is provided with a wide groove 12 and a T-shaped extractor plate 13 has a tongue 14 which is slidable in groove 12. Extractor plate 13 has two outwardly extending arms 15 and 16 and each arm has an extractor pin 17 which is engageable with holes in a standard electronic module. Extractor plate 13 has an elongated slot 18 therein and a pivot bushing 19 passes through slot 18.

An extracting cam 21 is also supported on pivot bushing 19 and, as extracting cam 21 is wider than groove 12, tongue 14 of extractor plate 13 is sandwiched between frame 11 and extractor plate 13. A screw 22 attaches pivot bushing 19 to frame 11. It can thus be seen that extractor plate 13 is slidably mounted between frame 11 and extracting cam 21 and that groove 12 provides straight-line motion to extractor plate 13.

A cam button 23 is attached to tongue 14 above slot 18 and extracting cam 21 has a cam surface 24 which is engageable with cam button 23. A handle 25 is formed integral with extracting cam 21 and is used for rotating extracting cam 21. Handle 25 is also provided with cam surface 26 which is also engageable with cam button 23. Cam surface 24 is used to raise extractor plate 13 and cam surface 26 is used to lower extractor plate 13.

OPERATION

Referring now to FIG. 1 of the drawing, frame 11 is provided with two notches and surfaces 27 and 28 are formed by the two notches. When it is desired to extract an electronic module from a chassis, surfaces 27 and 28 are placed on the top rails of the chassis and pins 17 are engaged in holes in the heat sink of a module. As viewed in FIG. 1 of the drawing, handle 25 is rotated in a clockwise direction and cam surface 24 on extracting cam 21 engages cam button 23 and raises extractor plate 13. As pins 17 are engaged with an electronic module, the male connector of the module is separated from the female connector in the chassis and the module can then be removed from the chassis.

Figure 3:
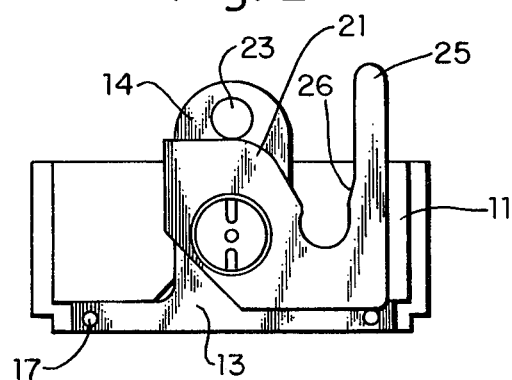
FIG. 3 is a front view similar to FIG. 1, but showing an extractor plate in a raised position.

FIG. 3 of the drawing shows the position of extractor plate 13 in a raised position after a module has been removed from the chassis. As viewed in FIG. 3 of the drawing, rotation of handle 25 in a counter-clockwise direction will cause cam surface 26 to engage cam button 23 thereby moving extractor plate 13 downwardly in preparation for another extraction.

The mechanical advantage provided by cam surface 24 engaging cam button 23 makes the present invention suitable for use where a large extraction force is required, such as the case where a 100 or more connector pins are used on an electronic plug-in module.

Obviously many modifications and variations of the present invention are possible in the light of the above teachings. It is therefore to be understood that the invention may be practiced otherwise than as specifically described.

I claim:

1. An extractor tool for removing an electronic plug-in module from a chassis comprising,
    a frame,
    an extractor plate slidably attached to said frame,
    a cam pin attached to said extractor plate,
    first cam means rotatably attached to said frame and engageable with said cam pin for linearly moving said extractor plate in a first direction,
    a handle for rotating said first cam means,
    first and second pins on said extractor plate for engaging an electronic plug-in module, and
    second cam means on said handle engageable with said cam pin for moving said extractor plate in a direction opposite to said first direction.

2. An extractor tool for removing an electronic plug-in module from a chassis, said tool comprising:
    a frame having a linear groove;
    an extractor plate having pins for engaging openings in a module, said plate also having a tongue slidably engaged in said groove whereby said plate is guide for linear movement relative to said frame, and said tongue having an elongated slot therein;
    a cam pin attached to said tongue of said extractor plate;
    pivot means extending from said frame through said slot in said tongue;
    first cam means rotatably attached to said frame by said pivot means with said tongue disposed between said first cam means and said frame, said first cam means being engageable with said cam pin;
    a handle for rotating said first cam means so as to act against said cam pin and effect said linear movement of said extractor plate in one direction; and
    second cam means on said handle engageable with said cam pin for effecting linear movement of said extractor plate in the opposite direction.

* * * * *